United States Patent
Tan et al.

(10) Patent No.: US 7,358,523 B2
(45) Date of Patent: Apr. 15, 2008

(54) METHOD AND STRUCTURE FOR DEEP WELL STRUCTURES FOR LONG WAVELENGTH ACTIVE REGIONS

(75) Inventors: Michael R. T. Tan, Menlo Park, CA (US); Ashish Tandon, Sunnyvale, CA (US); David P. Bour, Cupertino, CA (US)

(73) Assignee: Avago Technologies Fiber IP Pte Ltd, Singapore (SG)

( * ) Notice: Subject to any disclaimer, the term of this patent is extended or adjusted under 35 U.S.C. 154(b) by 0 days.

(21) Appl. No.: 10/970,528

(22) Filed: Oct. 20, 2004

(65) Prior Publication Data

US 2006/0083278 A1 Apr. 20, 2006

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .............. 257/14; 257/15; 257/17; 257/18; 257/E33.061

(58) Field of Classification Search ............ 257/13–15, 257/17–18, 79–90, E33.061; 438/22, 28–32, 438/46, 47
See application file for complete search history.

(56) References Cited

U.S. PATENT DOCUMENTS

| 5,425,042 A | | 6/1995 | Nido et al. | |
|---|---|---|---|---|
| 5,658,825 A | * | 8/1997 | Razeghi | ..................... 117/89 |
| 5,719,895 A | * | 2/1998 | Jewell et al. | .......... 372/45.012 |
| 2004/0099858 A1 | * | 5/2004 | Lee | ................. 257/13 |
| 2004/0135136 A1 | * | 7/2004 | Takahashi et al. | ............ 257/14 |
| 2005/0199870 A1 | * | 9/2005 | Gray et al. | ................... 257/14 |

* cited by examiner

*Primary Examiner*—Thien F Tran

(57) ABSTRACT

Subwells are added to quantum wells of light emitting semiconductor structures to shift their emission wavelengths to longer wavelengths. Typical applications of the invention are to InGaAs, InGaAsSb, InP and GaN material systems, for example.

12 Claims, 6 Drawing Sheets

METHOD AND STRUCTURE FOR DEEP WELL STRUCTURES FOR LONG WAVELENGTH ACTIVE REGIONS

BACKGROUND

There is an interest in extending the wavelength of active regions on GaAs and GaN. For longwave active regions on GaAs a number of suggestions have been made that fit into three approaches. The first approach relates to introducing nitrogen into an InGaAs quantum well to lower the quantum well bandgap; the second approach relates to using highly strained narrow bandgap GaAsSb quantum wells; and the third approach relates to increasing the strain to the point where quantum dot active regions are formed.

Of the three approaches, the first has been the most successful. However, growth of the nitrogen incorporating quantum wells by metal organic chemical vapor deposition (MOCVD) has been difficult because of the poor nitrogen incorporation into the InGaAs quantum wells. Additionally, the reliability of MOCVD grown InGaAs:N is undetermined because efforts have been primarily directed at molecular beam epitaxy (MBE) based growth techniques where the incorporation of nitrogen into InGaAs is easier.

In the second approach, GaAsSb quantum wells suffer from type II band alignment with GaAs and from the requirement of a low V/III ratio needed to grow antimonide based compounds on GaAs. The requirement of a low V/III ratio typically results in poor quality quantum wells.

In the third approach the low density of the quantum dots results in a low gain and broad spectra due to the randomness of the quantum dot size distribution.

For InGaN active regions on GaN, wavelengths are typically extended from the near ultraviolet to the blue or green portion of the spectrum by increasing the indium content by between about 30 percent to 50 percent. However, the optoelectronic quality of high indium content InGaN is severely degraded resulting in low efficiencies at long wavelengths.

SUMMARY OF INVENTION

In accordance with the invention, double well structures are created in the highly strained quantum well active regions by embedding deep ultra thin quantum wells. The perturbation introduced by the embedded, deep ultra thin quantum well lowers the confined energy state for the wavefunction in the surrounding larger well. This results in an active region operating at a longer wavelength allowing longer wavelength light emitting semiconductor structures such as longer wavelength vertical cavity surface emitting lasers (VCSELs) or longer wavelength light emitting diodes (LEDs) to be made.

DETAILED DESCRIPTION OF THE INVENTION

Figure 1A:
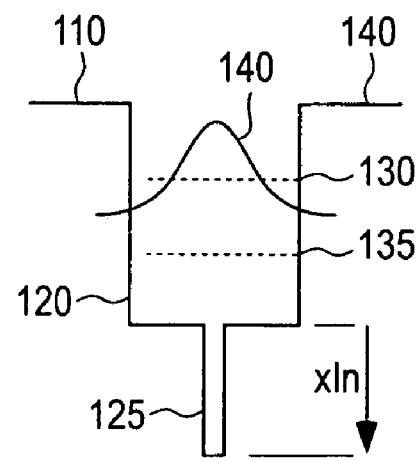
FIG. 1a shows a composition profile for a quantum well in accordance with the invention.

FIG. 1a shows a composition profile for a quantum well of an embodiment in accordance with the invention. GaAs barrier layer 110 provides the reference level of zero indium content at the top of InGaAs quantum well 120. InGaAs quantum well 120 is a highly strained quantum well in which embedded, deep, ultra-thin quantum well 125 is embedded into InGaAs quantum well 120 to make a subwell. Quantum well 120 is typical of quantum wells used on GaAs. The perturbation introduced by embedded, deep, ultra-thin quantum well 125 lowers confined energy state 130 of wavefunction 140 in quantum well 120 to confined energy state 135. A composition for embedded, deep, ultra-thin quantum well 125 is typically of the form $In_xGa_{(1-x)}As$ given a typical composition for quantum well 120 of $In_yGa_{(1-y)}As$ where y is typically in the range of about 0.35 to 0.4. The value of y is typically selected to achieve the longest wavelength possible from quantum well 120 without the addition of embedded, deep ultra-thin quantum well 125.

Figure 1B:
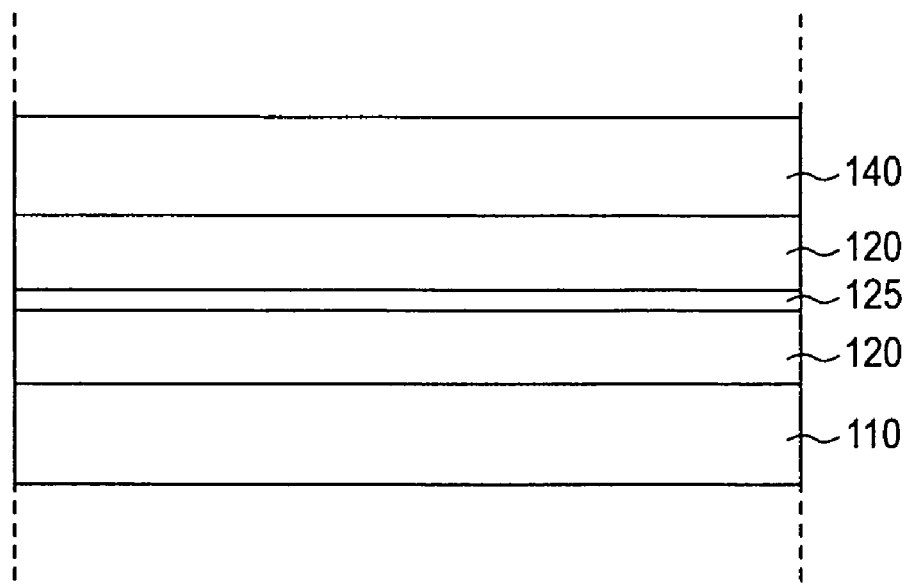
FIG. 1b shows a layer structure corresponding to FIG. 1a in accordance with the invention.

FIG. 1b shows a layer structure corresponding to the quantum well composition profile of FIG. 1a. Highly strained InGaAs quantum well layer 120 is grown on GaAs barrier layer 110, typically to a total thickness of about 60 angstrom. After the first approximately 30 angstrom of InGaAs quantum well layer 120 is grown, embedded, deep, ultra-thin $In_xGa_{(1-x)}As$ quantum well layer 125 is typically grown to a thickness of about 10 angstrom and growth is typically chosen to maintain a coherent layer so that embedded, deep, ultra-thin thin $In_xGa_{(1-x)}As$ quantum well layer 125 is also highly strained. Surfactants such as antimony may be introduced to allow for coherent growth of the quantum well layer or multiple quantum well stack. Introduction of antimony prevents relaxation of the overall quantum well structure by improving the mobility of the indium atoms during MOCVD surface reconstruction. Following growth of embedded, deep, ultra-thin thin $In_xGa_{(1-x)}As$ quantum well layer 120, growth of the remaining approximately 30 angstrom of highly strained InGaAs quantum well layer 120 is completed. GaAs barrier layer 140 is then grown over highly strained InGaAs quantum well layer 120.

Figure 2:
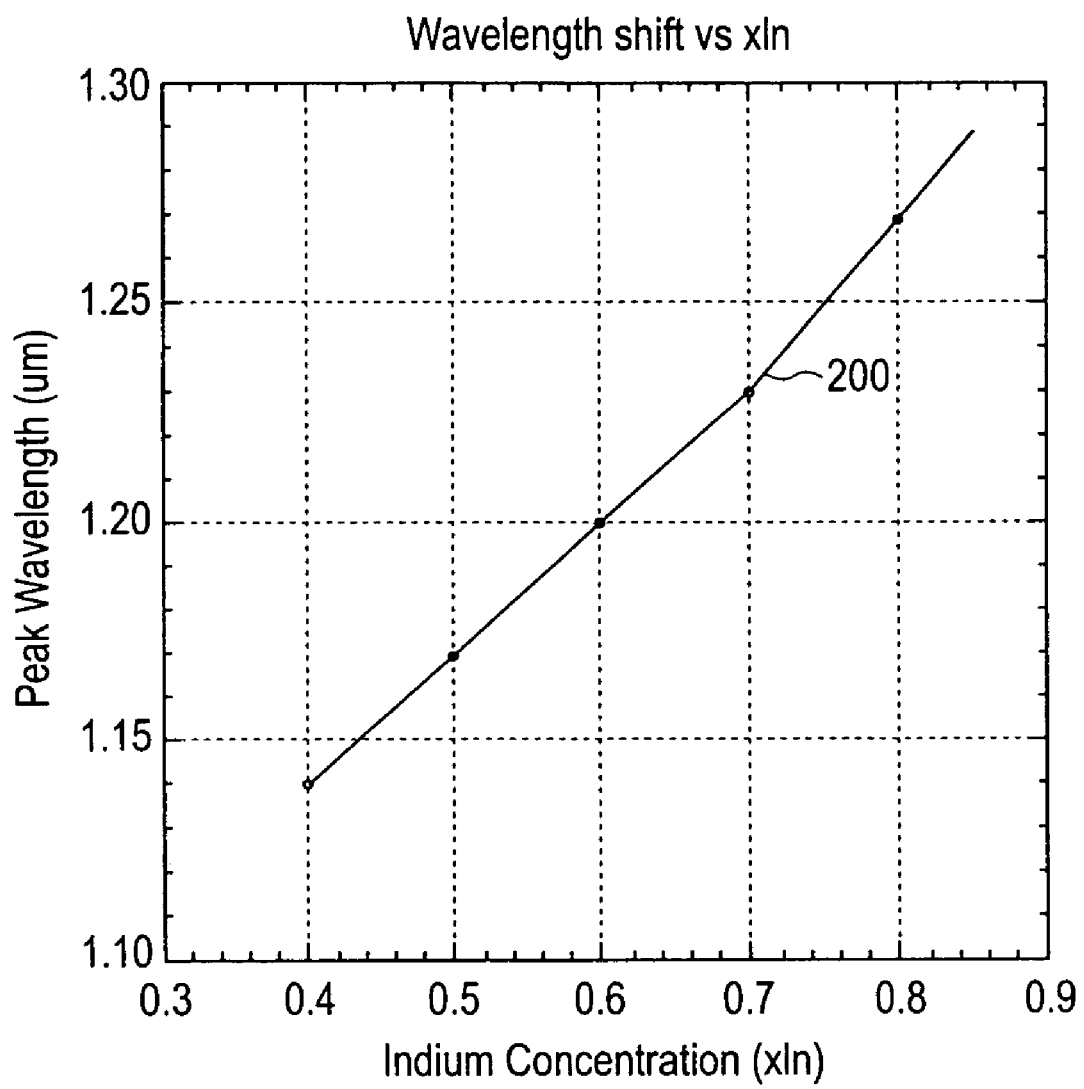
FIG. 2 shows the shift of wavelength with indium concentration in accordance with the invention.

Plot 200 in FIG. 2 shows the shift in wavelength versus indium composition of embedded, deep, ultra-thin $In_xGa_{(1-x)}As$ quantum well layer 125 having a thickness of about 10 angstrom for x in the range from about 0.4 to about 0.85. $In_yGa_{(1-y)}As$ quantum well layer 120 is about 60 angstroms thick where y is about 0.4. The unperturbed quantum well layer without embedded deep, ultra-thin $In_xGa_{(1-x)}As$ quantum well layer 125 corresponds to a 70 angstrom thick $In_yGa_{(1-y)}As$ quantum well layer with y about 0.4 with an emission wavelength of about 1140 nm. As seen from plot 200 in FIG. 2, the emission wavelength shifts approximately linearly with indium concentration at a rate of approximately 30 nm for a 0.1 increase in indium composition for x above a value of about 0.4. At an indium composition of 0.8, the emission wavelength has been increased to about 1270 nm.

Figure 3A:
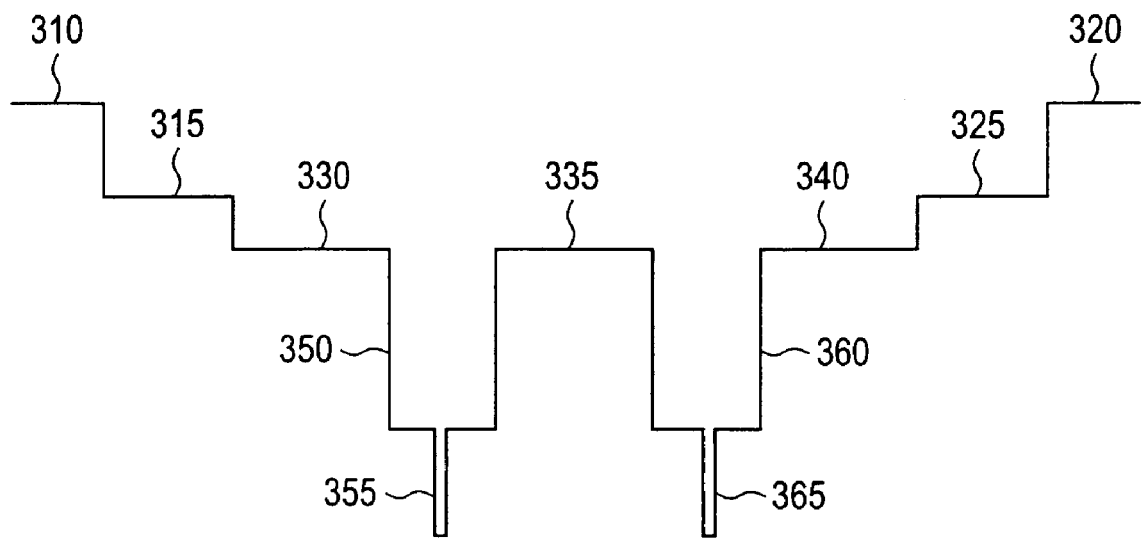
FIG. 3a shows a composition profile for a light emitting semiconductor structure in accordance with the invention.

FIG. 3a shows a composition profile similar to that of FIG. 1a in accordance with the invention. GaAs barrier layers 330 and 340 provide the reference energy at the top of $In_yGa_{(1-y)}As$ quantum well layers 350 and 360, respectively. $In_yGa_{(1-y)}As$ quantum well layers 350 and 360 are separated by GaAs barrier layer 335. Embedded, deep, ultra-thin $In_xGa_{(1-x)}As$ quantum well layer 355 is embedded in $In_yGa_{(1-y)}As$ quantum well layer 350 and embedded, deep, ultra-thin $In_xGa_{(1-x)}As$ quantum well layer 365 is embedded in $In_yGa_{(1-y)}As$ quantum well layer 360. The energy levels for AlGaAs layers 310 and 320 and $GaAs_{(1-z)}P_z$ layers 315 and 325 are also shown. Typical doping levels for the non-active layers are typically in the range from about $1\cdot 10^{17}/cm^3$ to $3\cdot 10^{18}/cm^3$.

Figure 3B:
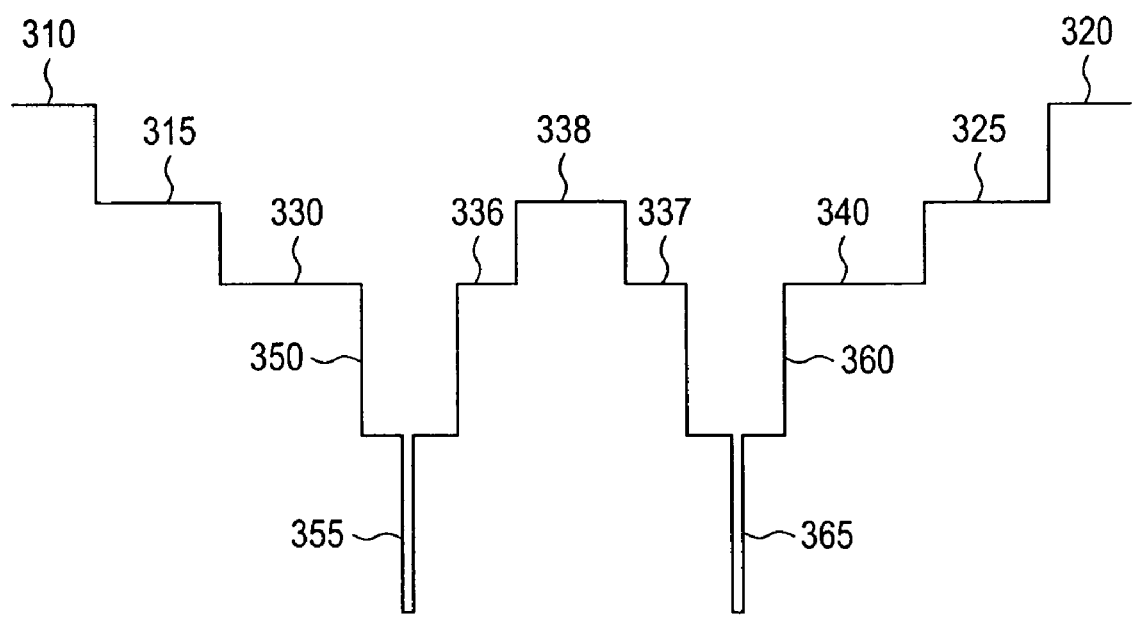
FIG. 3b shows a composition profile for a light emitting semiconductor structure in accordance with the invention.

FIG. 3b is similar to FIG. 3a except that additional strain reducing layer 338 has been introduced. Strain reducing layer 338 is introduced between $In_yGa_{(1-y)}As$ quantum well layers 350 and 360 changing GaAs barrier layer 335 into GaAs barrier layer 336 and GaAs barrier 337.

Figure 3C:
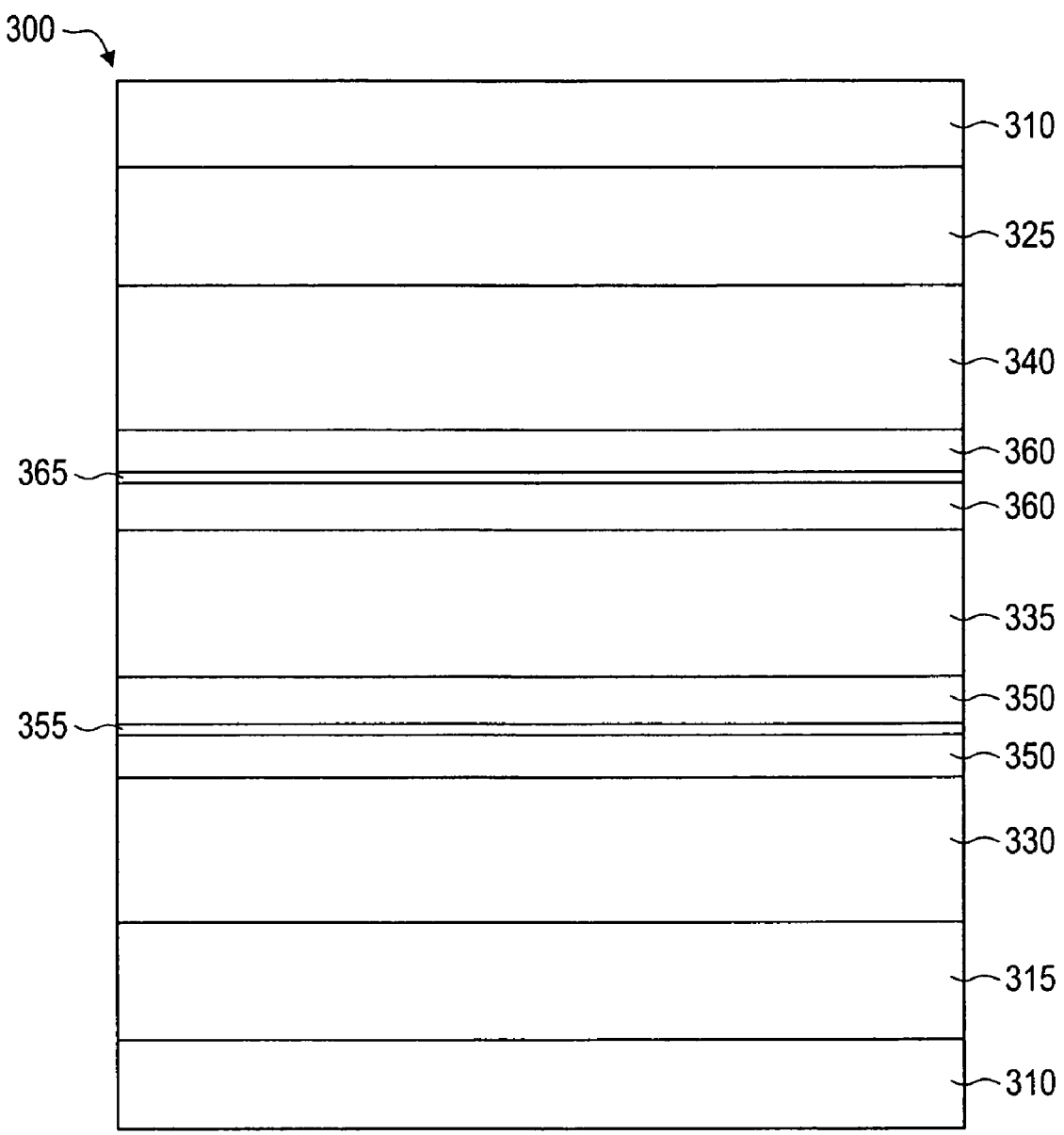
FIG. 3c shows a layer structure corresponding to FIG. 3a in accordance with the invention.

FIG. 3c shows layer structure 300 corresponding to the composition diagram of FIG. 3a. Growth of layer structure 300 is typically by MOCVD in a AIXTRON 2000 reactor at a typical growth temperature in the range from about 400° C. to 600° C., for example, 520° C. at a pressure typically on the order of about 100 mbar. The growth condition for the quantum well layers is typically selected so as to prevent indium segregation. This is typically accomplished by varying the growth rate, growth temperature, and strain of the quantum well layers. After growth of AlGaAs layer 310 for about 25 sec to a typical thickness of about 150 angstrom, $GaAs_{(1-z)}P_z$ layer 315 is grown for about 22 sec to a thickness of about 100 angstrom. $GaAs_{(1-z)}P_z$ layer 315 is a tensile strained layer introduced to minimize the integrated strain on layer structure 300 by acting as a strain compensation layer. $GaAs_{(1-z)}P_z$ layers 315 and 325 typically function to compensate for the increased strain typically introduced by embedded, deep ultra-thin $In_xGa_{(1-x)}As$ quantum well layers 355 and 365. Typical values for z are in the range from about 0.05 to about 0.30

Typically, $GaAs_{(1-z)}P_z$ layers 315 and 325 may be placed at the periphery of $In_yGa_{(1-y)}As$ quantum well layers 350 and 360 respectively, as well as at GaAs barrier layers 330 and 340. Other types of strain compensating layers GaAsN, AlGaAsP, GaInP, InGaAsP, AlInGaAsN may also be used.

GaAs barrier layer 330 is grown over $GaAs_{(1-z)}P_z$ layer 315. Growth for GaAs barrier layer 330 typically takes about 16 sec resulting in a typical thickness of about 100 angstrom. $In_yGa_{(1-y)}As$ quantum well layer 350, where y is typically in the range from about 0.3 to 0.45, is grown over GaAs barrier layer 330 for about 4 sec resulting in a typical thickness of about 30 angstrom. Then embedded, deep, ultra-thin $In_xGa_{(1-x)}As$ quantum well layer 355 is embedded in $In_yGa_{(1-y)}As$ quantum well layer 350. The value of x is typically selected to achieve emission close to 1300 nm in an embodiment in accordance with the invention. A typical 3 sec growth for embedded, deep, ultra-thin $In_xGa_{(1-x)}As$ quantum well layer 355 results in a typical thickness of about 10 angstrom. Growth of $In_yGa_{(1-y)}As$ quantum well layer 350 is then resumed for 4 sec typically resulting in additional thickness of about 30 angstrom. GaAs barrier layer 335 is grown over $In_yGa_{(1-y)}As$ quantum well layer 350. Growth for GaAs barrier layer 335 typically takes about 16 sec resulting in a typical thickness of about 100 angstrom.

$In_yGa_{(1-y)}As$ quantum well layer 360 where y is typically in the range from about 0.3 to 0.45, is grown over GaAs barrier layer 335 for about 4 sec resulting in a typical thickness of about 30 angstrom. Then embedded, deep, ultra-thin $In_xGa_{(1-x)}As$ quantum well layer 365 is embedded in $In_yGa_{(1-y)}As$ quantum well layer 360. A typical 3 sec growth for embedded, deep, ultra-thin $In_xGa_{(1-x)}As$ quantum well layer 365 results in a typical thickness of about 10 angstrom. Growth of $In_yGa_{(1-y)}As$ quantum well layer 360 is then resumed for 4 sec typically resulting in additional thickness of about 30 angstrom. GaAs barrier layer 340 is grown over $In_yGa_{(1-y)}As$ quantum well layer 360. Growth for GaAs barrier layer 340 typically takes about 16 sec resulting in a typical thickness of about 100 angstrom. $GaAs_{(1-z)}P_z$ layer 325 is grown for about 22 sec to a thickness of about 100 angstrom. $GaAs_{(1-z)}P_z$ layer 325 is a tensile strained layer introduced to minimize the integrated strain on layer structure 300 by acting as a strain compensation layer. Other types of strain compensating layers may be used. Then AlGaAs layer 310 is typically grown for about 25 sec to a typical thickness of about 150 angstrom.

Figure 4A:
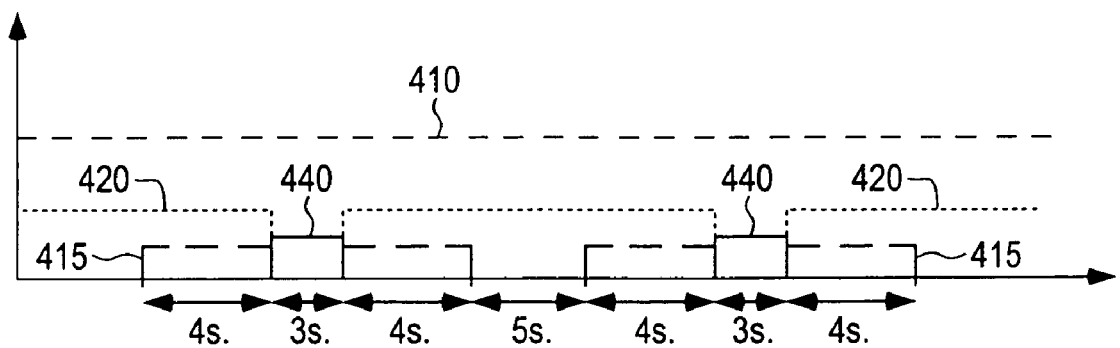
FIGS. 4a-4b show processing time and flow in accordance with the invention.
Figure 4B:
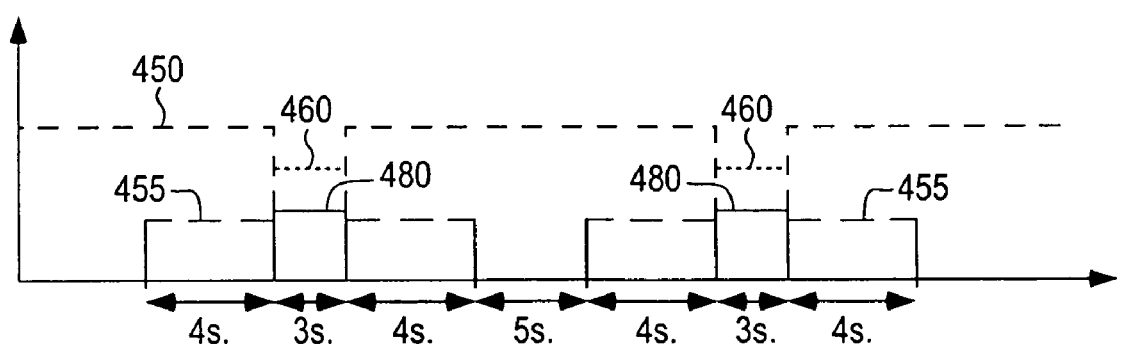

FIGS. 4a and 4b show the relevant gas flows for two growth schemes for $In_yGa_{(1-y)}As$ quantum well layers 350, 360 and embedded, deep, ultra-thin $In_xGa_{(1-x)}As$ quantum well layers 355 and 365 in accordance with the invention. In FIG. 4a, the flow of trimethylgallium 410 and the flow of triethylgallium 420 are initially on. Trimethylindium flow 415 is turned on for about 4 sec to grow the first about 30 angstrom of $In_yGa_{(1-y)}As$ quantum well layer 350. The flow of triethygallium 420 is shut off at the same time as the flow of trimethylindium 415 and the flow of trimethylindium 440 is turned on for about 3 sec to grow embedded, deep, ultra-thin $In_xGa_{(1-x)}As$ quantum well layer 355. When embedded, deep, ultra-thin $In_xGa_{(1-x)}As$ quantum well layer 355 is complete, the flow of triethygallium 420 is turned back on and the flow of trimethylindium 415 is turned on for about another 4 sec to grow the final about 30 angstrom of $In_yGa_{(1-y)}As$ quantum well layer 350. Then GaAs barrier layer 335 is grown for about 5 sec. When growth of GaAs barrier layer 335 is complete, the flow of trimethylindium 415 is turned on for about 4 sec to grow the first about 30 angstrom of $In_yGa_{(1-y)}As$ quantum well layer 360. The flow of triethygallium 420 is shut off at the same time as the flow of trimethylindium 415 and the flow of trimethylindium 440 is turned on for about 3 sec to grow embedded, deep, ultra-thin $In_xGa_{(1-x)}As$ quantum well layer 365. When embedded, deep, ultra-thin $In_xGa_{(1-x)}As$ quantum well layer 365 is complete, the flow of triethygallium 420 is turned back on and the flow of trimethylindium 415 is turned on for about another 4 sec to grow the final about 30 angstrom of $In_yGa_{(1-y)}As$ quantum well layer 360.

In FIG. 4b, the flow of trimethylgallium 450 is initially on. The flow of trimethylindium 455 is turned on for about 4 sec to grow the first about 30 angstrom of $In_yGa_{(1-y)}As$ quantum well layer 350 and is then shut off along with the flow of trimethylgallium 450. The flow of triethylgallium 460 and trimethylindium 480 are then turned on for about 3 sec to grow embedded, deep, ultra-thin $In_xGa_{(1-x)}As$ quantum well layer 355. When embedded, deep, ultra-thin $In_xGa_{(1-x)}As$ quantum well layer 355 is complete, the flow of trimethylgallium 450 is turned on and the flow of trimethylindium 455 is turned on for about 4 sec to grow the final about 30 angstrom of $In_yGa_{(1-y)}As$ quantum well layer 350. Then GaAs barrier layer 335 is grown for about 5 sec. When growth of GaAs barrier layer 335 is complete, the flow of trimethylindium 455 is turned on for about 4 sec to grow the first about 30 angstrom of $In_yGa_{(1-y)}As$ quantum well layer 360 and is then shut off along with the flow of trimethylgallium 450. The flow of triethylgallium 460 and trimethylindium 480 are then turned on for about 3 sec to grow embedded, deep, ultra-thin $In_xGa_{(1-x)}As$ quantum well layer 365. When embedded, deep, ultra-thin $In_xGa_{(1-x)}As$ quantum well layer 365 is complete, the flow of trimethylgallium 450 is turned on and the flow of trimethylindium 455 is turned on for about 4 sec to grow the final about 30 angstrom of $In_yGa_{(1-y)}As$ quantum well layer 350.

Figure 5:
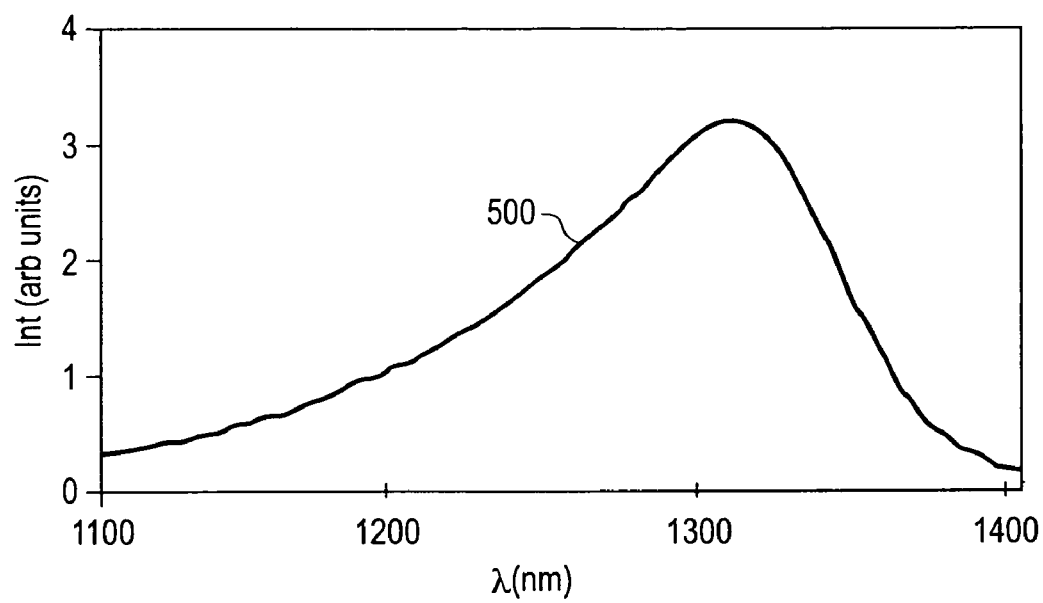
FIG. 5 shows the shift in wavelength in accordance with the invention.

FIG. 5 shows the measured room temperature luminescence spectra 500 of an exemplary embodiment in accordance with the invention. The peak of the luminescence spectra 500 occurs at about 1300 nm demonstrating the feasibility of extending the emission wavelength to 1300 nm using deep ultra-thin quantum well layers.

Figure 6:
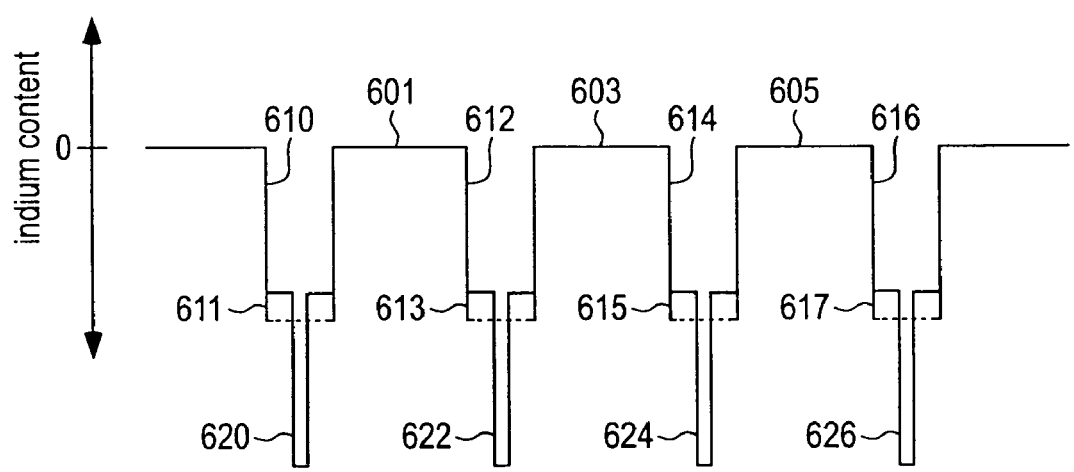
FIG. 6 shows a comparison between composition profiles in accordance with the invention and prior art composition profiles.

In accordance with the invention, the emission wavelength may be extended using deep quantum well layers in other material systems such as InGaAsSb, InP and GaN. For example, FIG. 6 shows a composition profile for $In_yGa_{(1-y)}N$ multiple quantum well layers 610, 612, 614 and 616 with embedded deep, ultra-thin $In_xGa_{(1-x)}N$ quantum well layers 620, 622, 624 and 626, respectively, for nitride green light emitting diodes (LEDs) or nitride green laser diodes in accordance with the invention superimposed over a composition profile for prior art $In_yGa_{(1-y)}N$ multiple quantum well layers 611, 613, 615 and 617. Note that $In_yGa_{(1-y)}N$ multiple quantum well layers 610, 612, 614 and 616 with embedded deep, ultra-thin $In_xGa_{(1-x)}N$ quantum well layers 620, 622, 624 and 626 in accordance with the invention, respectively, are completely analogous to $In_yGa_{(1-y)}As$ quantum well layers 350 and 360 with embedded, deep $In_xGa_{(1-x)}As$ quantum well layers 355 and 365, respectively and separated by GaN barrier layers 601, 603 and 605. $In_yGa_{(1-y)}N$ multiple quantum well layers 611, 613, 615 and 617 typically each have a thickness in the range from about 3 nm to about 4 nm. Use of $In_yGa_{(1-y)}N$ multiple quantum well layers 610, 612, 614 and 616 with embedded deep, ultra-thin $In_xGa_{(1-x)}N$ quantum well layers 620, 622, 624 and 626, respectively, allows the indium content of $In_yGa_{(1-y)}N$ multiple quantum well layers 610, 612, 614 and 616 to typically be reduced by several percent. However, typical values for x are typically greater than about 0.5 for embedded deep, ultra-thin $In_xGa_{(1-x)}N$ quantum well layers 620, 622, 624 and 626.

The strong piezoelectric fields present in conventional prior art $In_yGa_{(1-y)}N$ multiple quantum well layers 611, 613, 615 and 617 cause a separation of the electron and hole wavefunctions in conventional prior art $In_yGa_{(1-y)}N$ multiple quantum well layers 611, 613, 615 and 617 which reduces the probability of both spontaneous and stimulated emission. For nitride LEDs or laser diodes, a further benefit of using $In_yGa_{(1-y)}N$ multiple quantum well layers 610, 612, 614 and 616 with embedded deep, ultra-thin $In_xGa_{(1-x)}N$ quantum well layers 620, 622, 624 and 626, respectively, in accordance with the invention, is that the probability of radiative recombination is enhanced compared to conventional prior art $In_yGa_{(1-y)}N$ multiple quantum well layers 611, 613, 615 and 617. In the most general case, embedded deep, ultra-thin $In_xGa_{(1-x)}N$ quantum well layers 620, 622, 624 and 62 may be displaced from the center of $In_yGa_{(1-y)}N$ multiple quantum well layers 610, 612, 614 and 616, respectively, to optimize performance. Typically this would involve achieving the longest wavelength with the minimum indium content and maximum recombination probability.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. A light emitting semiconductor structure comprising:
a substrate;
a plurality of semiconductor layers formed on said substrate;
one of said semiconductor layers comprising a first quantum well layer having a first indium content; and
a second quantum well layer having a second indium content, said second quantum well layer being embedded in said first quantum well layer, said first and second quantum well layers each having a constant energy state, said first and second quantum well layers being continuous over said substrate and forming a coherent layer, said first and second quantum well layers further comprising antimony, wherein said second indium content is higher than said first indium content.

2. The structure of claim 1 wherein said second quantum well layer comprises indium, gallium and arsenic.

3. The structure of claim 1 wherein said light emitting semiconductor structure is a light emitting diode.

4. The structure of claim 1 wherein said second quantum well layer is embedded in the middle of said first quantum well layer.

5. The structure of claim 1 wherein one of said semiconductor layers is a tensile strained layer.

6. The structure of claim 5 wherein said tensile strained layer is comprised of GaAsP.

7. A method for fabricating a light emitting semiconductor structure comprising:
providing a substrate;
forming a plurality of semiconductor layers on said substrate;
putting a first quantum well layer having a first indium content in one of said semiconductor layers; and
embedding a second quantum well layer having a second indium content in said first quantum well layer, said first and second quantum well layers each having a constant energy state, said first and second quantum well layers being continuous over said substrate and forming a coherent layer, said first and second quantum well layers further comprising antimony, wherein said second indium content is higher than said first indium content.

8. The method of claim 7 wherein said second quantum well layer comprises indium, gallium and arsenic.

9. The method of claim 7 wherein said light emitting semiconductor structure is a light emitting diode.

10. The method of claim 7 wherein said second quantum well layer is embedded in the middle of said first quantum well layer.

11. The method of claim 7 wherein one of said semiconductor layers is a tensile strained layer.

12. The method of claim 11 wherein said tensile strained layer is comprised of GaAsP.

* * * * *